(12) United States Patent
Suzuki

(10) Patent No.: US 12,100,718 B2
(45) Date of Patent: Sep. 24, 2024

(54) SOLID STATE IMAGE SENSOR HAVING A GRID-PATTERNED INTER-PIXEL ISOLATION SECTION SEPARATING THE PHOTOELECTRIC CONVERSION SECTIONS OF EACH OF THE PIXELS FROM ONE ANOTHER AND PROVIDED WITH PROTRUDING SECTIONS

(71) Applicant: SONY SEMICONDUCTOR SOLUTIONS CORPORATION, Kanagawa (JP)

(72) Inventor: Ryoji Suzuki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/203,809

(22) Filed: May 31, 2023

(65) Prior Publication Data

US 2023/0307470 A1  Sep. 28, 2023

Related U.S. Application Data

(63) Continuation of application No. 17/950,149, filed on Sep. 22, 2022, now Pat. No. 11,742,366, which is a
(Continued)

(30) Foreign Application Priority Data

Jan. 30, 2017  (JP) ................................. 2017-014312

(51) Int. Cl.
  *H01L 27/146*  (2006.01)
(52) U.S. Cl.
  CPC .. *H01L 27/14607* (2013.01); *H01L 27/14621* (2013.01); *H01L 27/14627* (2013.01);
(Continued)

(58) Field of Classification Search
  CPC ......... H01L 27/14607; H01L 27/14621; H01L 27/14627; H01L 27/14629; H01L 27/1463;
(Continued)

(56) References Cited

U.S. PATENT DOCUMENTS

| 11,495,628 B2 | 11/2022 | Suzuki |
| 2012/0217601 A1 | 8/2012 | Miyanami |

(Continued)

FOREIGN PATENT DOCUMENTS

| CN | 102651376 | 8/2012 |
| JP | H08-097391 | 4/1996 |

(Continued)

OTHER PUBLICATIONS

International Search Report and Written Opinion for International (PCT) Patent Application No. PCT/JP2018/001088, dated Apr. 10, 2018, 8 pages.

(Continued)

*Primary Examiner* — Ermias T Woldegeorgis
(74) *Attorney, Agent, or Firm* — Sheridan Ross PC

(57) ABSTRACT

The present technology relates to a solid-state imaging element and electronic equipment that allow an increase in the signal charge amount Qs that each pixel can accumulate. A solid-state imaging element according to the first aspect of the present technology includes: a photoelectric conversion section formed in each pixel; and an inter-pixel separation section separating the photoelectric conversion section of each pixel, in which the inter-pixel separation section includes a protruding section having a shape protruding toward the photoelectric conversion section. The present technology can be applied to a back-illuminated CMOS image sensor, for example.

16 Claims, 14 Drawing Sheets

Related U.S. Application Data continuation of application No. 16/478,431, filed as application No. PCT/JP2018/001088 on Jan. 17, 2018, now Pat. No. 11,495,628.

(52) U.S. Cl.
CPC .... H01L 27/14629 (2013.01); H01L 27/1463 (2013.01); H01L 27/1464 (2013.01); H01L 27/14645 (2013.01)

(58) Field of Classification Search
CPC .......... H01L 27/1464; H01L 27/14645; H01L 27/1462; H01L 31/02; H01L 27/146; H01L 27/14603; H04N 5/355; H04N 5/374; H04N 9/07; H04N 23/12; H04N 25/57; H04N 25/76
See application file for complete search history.

(56) References Cited

U.S. PATENT DOCUMENTS

| | | | |
|---|---|---|---|
| 2014/0054662 A1 | 2/2014 | Yanagita et al. | |
| 2015/0228684 A1 | 8/2015 | Yamashita et al. | |
| 2016/0056200 A1 | 2/2016 | Lee et al. | |
| 2016/0099267 A1* | 4/2016 | Lee ................ | H01L 27/14689 257/294 |
| 2016/0211288 A1 | 7/2016 | Yanagita et al. | |
| 2017/0012066 A1 | 1/2017 | Choi et al. | |
| 2017/0170217 A1 | 6/2017 | Yanagita et al. | |
| 2017/0271385 A1 | 9/2017 | Yanagita et al. | |
| 2023/0016268 A1 | 1/2023 | Suzuki | |

FOREIGN PATENT DOCUMENTS

| | | |
|---|---|---|
| JP | 2010199668 A | 9/2010 |
| JP | 2010-267827 | 11/2010 |
| JP | 2011-222900 | 11/2011 |
| JP | 2012-164768 | 8/2012 |
| JP | 2012-175050 | 9/2012 |
| JP | 2013-030803 | 2/2013 |
| JP | 2013-128036 | 6/2013 |
| JP | 2013-175494 | 9/2013 |
| JP | 2015-153772 | 8/2015 |
| KR | 20100096003 A | 9/2010 |
| KR | 10-2016-0039877 | 4/2016 |
| KR | 10-2017-0006520 | 1/2017 |

OTHER PUBLICATIONS

Extended European Search Report for European Patent Application No. 18745307.1, dated Jan. 31, 2020, 6 pages.
Official Action for U.S. Appl. No. 16/478,431, dated Oct. 22, 2021, 10 pages.
Official Action for U.S. Appl. No. 16/478,431, dated Apr. 25, 2022, 11 pages.
Notice of Allowance for U.S. Appl. No. 16/478,431, dated Jun. 23, 2022, 9 pages.
Corrected Notice of Allowance for U.S. Appl. No. 16/478,431, dated Aug. 23, 2022, 2 pages.
Notice of Allowance for U.S. Appl. No. 17/950,149, dated Mar. 1, 2023, 9 pages.

* cited by examiner

SOLID STATE IMAGE SENSOR HAVING A GRID-PATTERNED INTER-PIXEL ISOLATION SECTION SEPARATING THE PHOTOELECTRIC CONVERSION SECTIONS OF EACH OF THE PIXELS FROM ONE ANOTHER AND PROVIDED WITH PROTRUDING SECTIONS

CROSS REFERENCE TO RELATED APPLICATIONS

This application is a continuation application of U.S. patent application Ser. No. 17/950,149, filed Sep. 22, 2022, which is a continuation application of U.S. patent application Ser. No. 16/478,431, filed Jul. 16, 2019, now U.S. Pat. No. 11,495,628, which is a national stage application under 35 U.S.C. 371 and claims the benefit of PCT Application No. PCT/JP2018/001088 having an international filing date of 17 Jan. 2018, which designated the United States, which PCT application claimed the benefit of Japanese Patent Application No. 2017-014312 filed 30 Jan. 2017, the entire disclosures of each of which are incorporated herein by reference.

TECHNICAL FIELD

The present technology relates to a solid-state imaging element and electronic equipment, and particularly relates to a solid-state imaging element and electronic equipment that suppress color mixture between pixels, improve the light receiving sensitivity in each pixel, and moreover, increase the signal charge amount Qs that each pixel can accumulate.

BACKGROUND ART

A method conventionally proposed forms an insulative and/or reflective wall between pixels of a solid-state imaging element to suppress color mixture between the pixels. Further, another method proposed forms an anti-reflection film with a moth-eye structure on an Si interface on a light incident side of each pixel of a solid-state imaging element to confine incident light within the pixels and increase the optical path length. This, as a result, increases the light receiving sensitivity of PDs (photodiodes) (see PTL 1, for example)

CITATION LIST

Patent Literature

[PTL 1]
  Japanese Patent Laid-Open No. 2015-29054

SUMMARY

Technical Problem

According to the above-described conventional technology, it is possible to suppress color mixture between pixels and increase the light receiving sensitivity of each pixel. However, it is not possible, at the same time, to easily increase the signal charge amount Qs that each pixel can accumulate.
The present technology has been made in view of such circumstances and allows an increase in the signal charge amount Qs of each pixel in addition to providing the effects obtained by the above-described conventional technology.

Solution to Problem

A solid-state imaging element according to a first aspect of the present technology includes: a photoelectric conversion section formed in each pixel; and an inter-pixel separation section separating the photoelectric conversion section of each pixel, in which the inter-pixel separation section includes a protruding section having a shape protruding toward the photoelectric conversion section.

The solid-state imaging element according to the first aspect of the present technology can further include a region between the inter-pixel separation section and the photoelectric conversion section, the region being different in conductivity type from the photoelectric conversion section.

The inter-pixel separation section can include at least one of a material having a refractive index lower than the photoelectric conversion section or a light reflection material.

The inter-pixel separation section can include a DTI formed on a substrate from a light incident surface side.

The inter-pixel separation section can include a DTI formed on the substrate from a surface side opposite to a light incident surface.

The inter-pixel separation section can be formed in a grid pattern such that the photoelectric conversion section is separated for each pixel.

A length of the inter-pixel separation section in a depth direction can be different between the protruding section and a side of the grid pattern.

The protruding section included in the inter-pixel separation section can vary according to each pixel color.

The protruding section included in the inter-pixel separation section can vary in length according to each pixel color.

The protruding section included in the inter-pixel separation section can vary in width according to each pixel color.

The protruding section included in the inter-pixel separation section can vary in number according to each pixel color.

The protruding section included in the inter-pixel separation section can vary according to a pattern of a shared pixel.

The protruding section included in the inter-pixel separation section can vary in length according to the pattern of the shared pixel.

The protruding section included in the inter-pixel separation section can vary in width according to the pattern of the shared pixel.

The protruding section included in the inter-pixel separation section can vary in number according to the pattern of the shared pixel.

The protruding section included in the inter-pixel separation section can vary according to a distance from an optical center to a corresponding pixel.

The inter-pixel separation section including the protruding section cannot include a part in which a portion in a lateral direction and a portion in a longitudinal direction are perpendicular to each other.

A side of the grid pattern of the inter-pixel separation section can have a linear shape.

A side of the grid pattern of the inter-pixel separation section can have a zigzag shape.

A side of the grid pattern of the inter-pixel separation section can have a triangular wave shape.

A side of the grid pattern of the inter-pixel separation section can have a shape of continuous semicircles.

A side of the grid pattern of the inter-pixel separation section can have a shape of continuous semi-rectangles.

The inter-pixel separation section can include a well region different in conductivity type from the photoelectric conversion section.

A solid-state imaging element according to a second aspect of the present technology includes a photoelectric conversion section formed in each pixel; a grid-patterned inter-pixel separation section separating the photoelectric conversion section of each pixel; and a columnar protruding section formed inside the photoelectric conversion section.

The solid-state imaging element according to the second aspect of the present technology can further include a well region between the inter-pixel separation section and the protruding section; and the photoelectric conversion section, the well region being different in conductivity type from the photoelectric conversion section.

The protruding section can include at least one of a material having a refractive index lower than the photoelectric conversion section or a light reflection material.

The protruding section can include a DTI formed on a substrate from a light incident surface side, and the inter-pixel separation section can include a DTI formed on the substrate from a surface side opposite to a light incident surface.

The protruding section can have a cylindrical shape.

The protruding section can have a polygonal column shape.

The solid-state imaging element can include a back-illuminated type.

Electronic equipment according to a third aspect of the present technology includes a solid-state imaging element, in which the solid-state imaging element includes a photoelectric conversion section formed in each pixel, and an inter-pixel separation section separating the photoelectric conversion section of each pixel, and the inter-pixel separation section includes a protruding section having a shape protruding toward the photoelectric conversion section.

Electronic equipment according to a fourth aspect of the present technology includes a solid-state imaging element, in which the solid-state imaging element includes a photoelectric conversion section formed in each pixel, a grid-patterned inter-pixel separation section separating the photoelectric conversion section of each pixel, and a columnar protruding section formed inside the photoelectric conversion section.

Advantageous Effect of Invention

According to the first to fourth aspects of the present technology, it is possible to increase the signal charge amount Qs of each pixel while increasing the light receiving sensitivity thereof.

DESCRIPTION OF EMBODIMENTS

Hereinafter, the best modes for carrying out the present technology (hereinafter referred to as embodiments) will be described in detail with reference to the drawings.

First Embodiment

Figure 1:
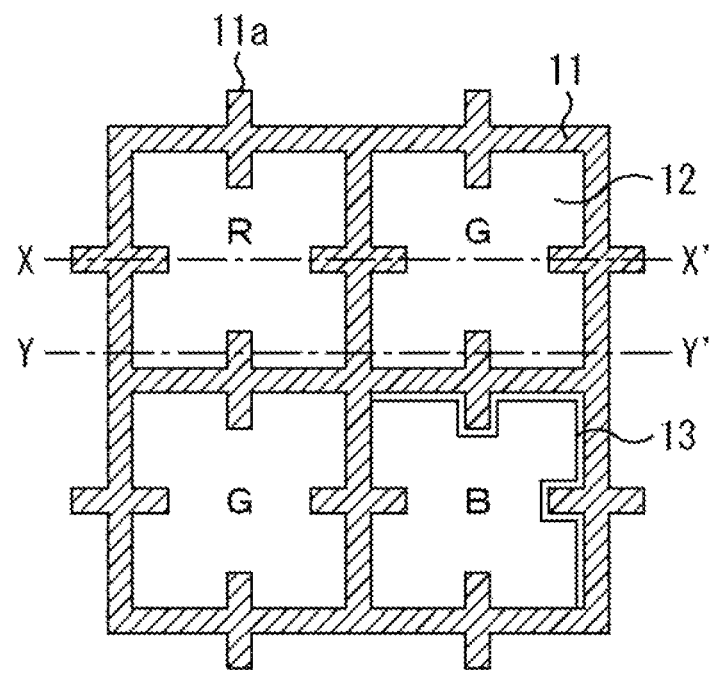
FIG. 1 is a horizontal cross-sectional diagram depicting a first configuration example of a solid-state imaging element to which the present technology is applied.
Figure 2:
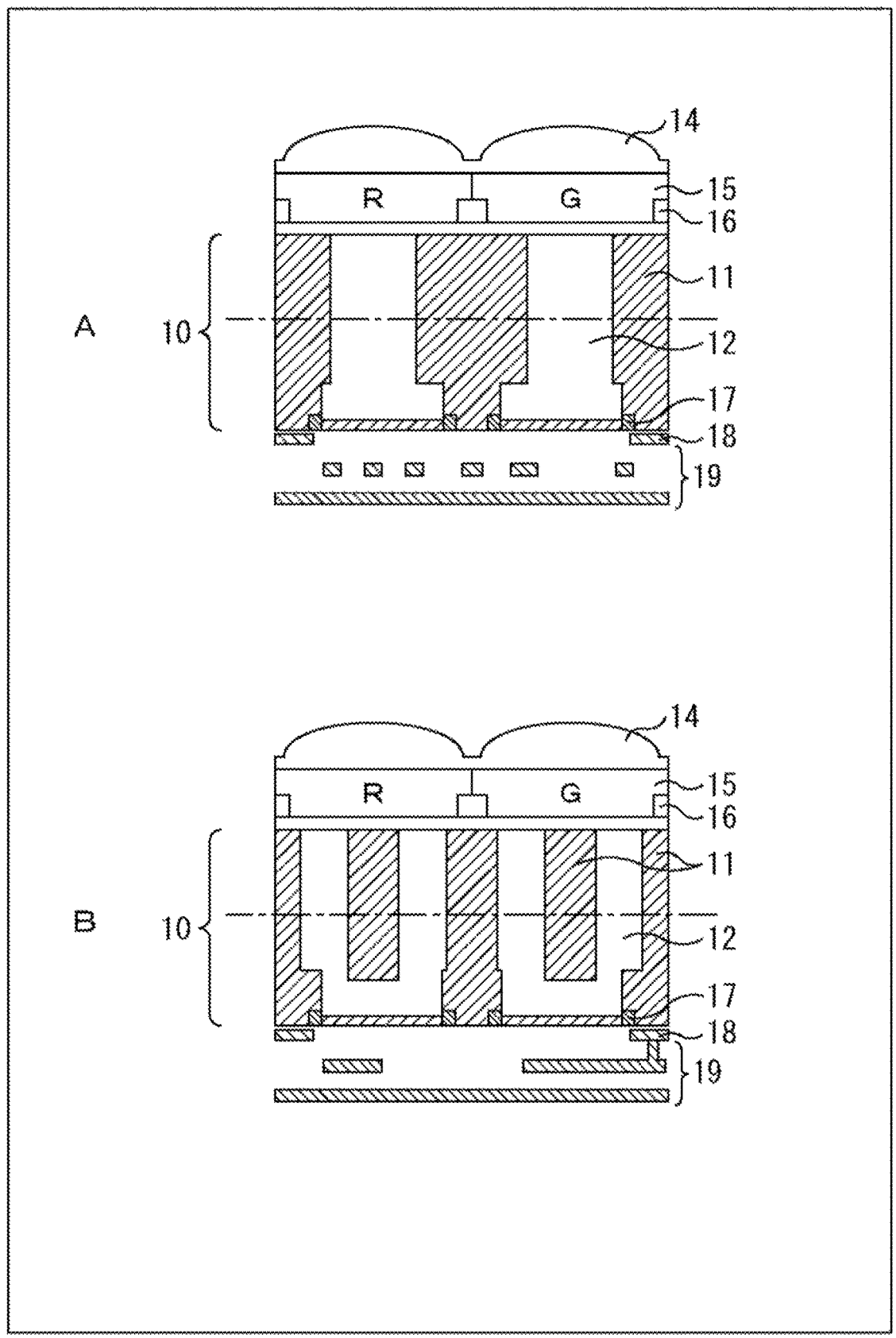
FIG. 2 is a vertical cross-sectional diagram depicting the first configuration example of the solid-state imaging element to which the present technology is applied.

A configuration example (a first configuration example) of a solid-state imaging element according to the first embodiment of the present technology will be described. FIG. 1 depicts a cross section in the horizontal direction in the vicinity of the center of an Si substrate in the first configuration example. A of FIG. 2 depicts a cross-sectional diagram in the vertical direction, taken along line X-X' of FIG. 1. B of FIG. 2 depicts a cross-sectional diagram in the vertical direction, taken along line Y-Y' of FIG. 1.

In the first configuration example, as depicted in FIG. 1, an inter-pixel separation section 11 includes a P-type well region and is formed in a grid pattern so as to rectangularly surround each pixel. A PD 12 is formed in each region surrounded by the grid-patterned inter-pixel separation section 11. The PD 12 includes an N-type region, which is different in conductivity from the inter-pixel separation section 11 (P-type well region).

Protruding sections 11a are formed in the grid-patterned inter-pixel separation section 11 surrounding the PDs 12. The protruding sections 11a protrude toward the PDs 12 from the center of respective sides of each rectangle. It is noted that the length of the inter-pixel separation section 11 in the depth direction is different between the sides of the grid pattern and the protruding sections 11a, and the sides of the grid pattern are formed so as to be greater in length (depth) than the protruding sections 11a. However, the protruding sections 11a may be formed so as to be greater in length (depth) than the sides of the grid pattern or both thereof may be equal to each other in length (depth).

Further, the first configuration example is of a back-illuminated type, as depicted in FIG. 2. OCLs (on-chip lenses) 14 and CFs (color filters) 15 are formed on an Si substrate 10 on the incident surface side. Pixel Trs (transistors) 18 and a wiring layer 19 are formed on a surface opposite to the incident surface of the Si substrate 10. Each inter-CF light blocking section 16 is formed between the CFs 15 of respective pixels. Each STI (Shallow Trench Isolation) 18 is formed between pixels on the surface opposite to the incident surface side of the Si substrate 10.

In the case of the first configuration example, the protruding sections 11a are formed in the inter-pixel separation section 11. This configuration, therefore, increases the surface area of PN joint portions 13, compared with the case where the inter-pixel separation section 11 has a simple rectangle shape without the protruding sections 11a. Each PN joint portion 13 is a portion where the inter-pixel separation section 11 including the P-type well region and the corresponding PD 12 including the N-type region are in contact with each other. Since the PN joint portions 13 have a role of storing signal charges, the first configuration example with the increased surface area of the PN joint portions 13 can increase the signal charge amount Qs of each pixel.

It is noted that since a DTI (Deep Trench. Isolation) described later is not formed in the first configuration example, the first configuration example can be manufactured by a similar process to a conventional solid-state imaging element.

Second Embodiment

Figure 3:
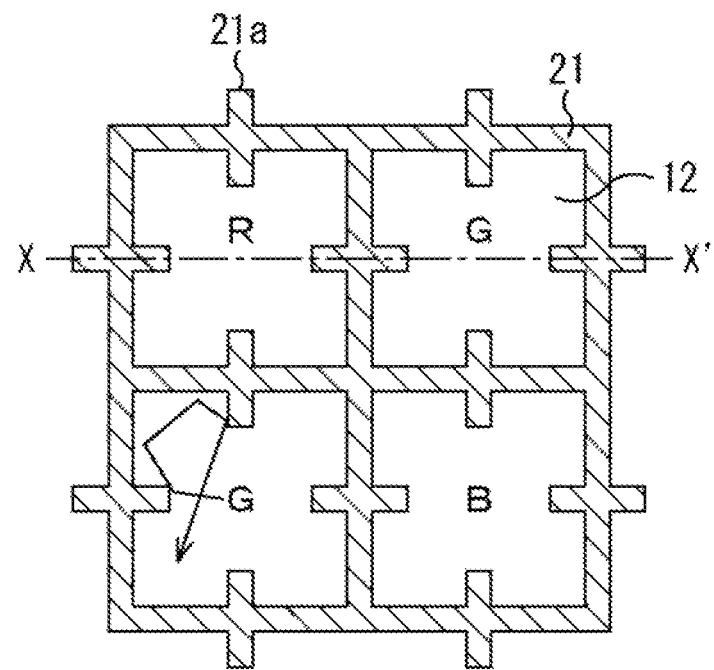
FIG. 3 is a horizontal cross-sectional diagram depicting a second configuration example of the solid-state imaging element to which the present technology is applied.
Figure 4:
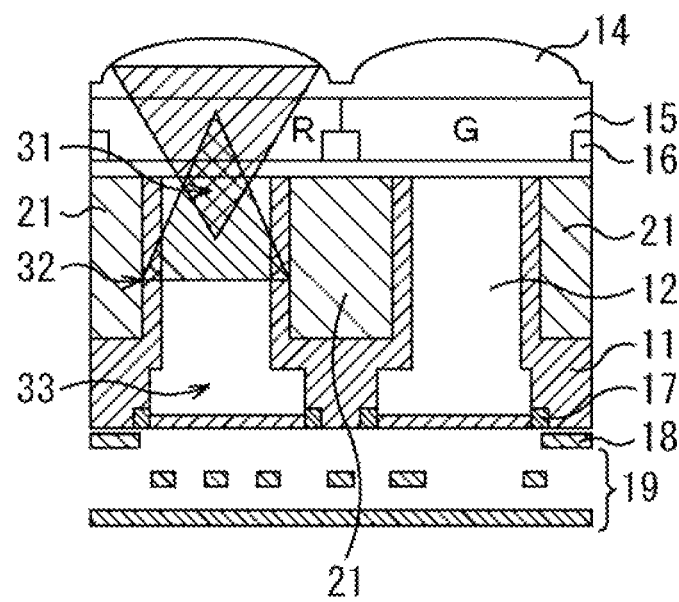
FIG. 4 is a vertical cross-sectional diagram depicting the second configuration example of the solid-state imaging element to which the present technology is applied.

Next, a configuration example (a second configuration example) of the solid-state imaging element according to the second embodiment of the present technology will be described. FIG. 3 depicts a cross section in the horizontal direction in the vicinity of the center of the Si substrate in the second configuration example. FIG. 4 depicts a cross-sectional diagram in the vertical direction, taken along line X-X' of FIG. 2. It is noted that components common to those in the first configuration example are denoted with the same signs and a description thereof will be omitted as appropriate.

In the second configuration example, a grid-patterned inter-pixel separation section 21 having a similar shape to the inter-pixel separation section 11 in the first configuration example is formed. That is, the inter-pixel separation section 21 including protruding sections is formed as a DTI. It is noted that a method of forming the inter-pixel separation section 21 as the DTI in the second configuration example is not particularly described, and any method can be employed.

That is, in the second configuration example, as depicted in FIG. 3, the grid-patterned inter-pixel separation section 21 including protruding sections 21a is formed as the DTI. For example, the inter-pixel separation section 21 includes a single film layer or a laminated film such as AlO, HfO, $SiO_2$, W, and/or poly-Si.

Further, each PD 12 is formed in a corresponding one of the regions surrounded by the inter-pixel separation section 21. Each P-type well region 22 is formed between the inter-pixel separation section 21 and the corresponding PD 12.

In the second configuration example, light collected by the OCL 14 is narrowed at an interface 31 of the Si substrate 10 such that a light collection spot enters the substrate, as depicted in FIG. 4. As a result, the incident light strikes a side wall at a deep portion of the Si substrate 10. Thus, the incident light passes through the inside of the Si substrate 10 having a relatively high refractive index and then strikes a side wall 32 of the inter-pixel separation section 21 having a low refractive index. This configuration can, therefore, suppress leakage of the incident light into adjacent pixels, compared with the case where the incident light strikes the side wall at a shallow portion of the Si substrate 10. This, as a result, allows suppression of color mixture.

In the case of the second configuration example, the P-type well regions 22 are formed between the inter-pixel separation section 21 including the protruding sections 21a and the respective PDs 12. As in the first configuration example, therefore, this configuration increases the surface area of the PN joint portions. Thus, the second configuration example can also increase the signal charge amount Qs of each pixel.

Further, in the case of the second configuration example, the inter-pixel separation section 21 including the protruding sections 21a can increase the area of the side wall in each pixel that the incident light strikes, compared with the inter-pixel separation section 21 without the protruding sections 21a. Moreover, since the incident light can also be reflected in the horizontal direction, the optical path length in each PD 12 can be increased. This configuration can, therefore, increase the light receiving sensitivity of each PD 12.

Third Embodiment

Figure 5:
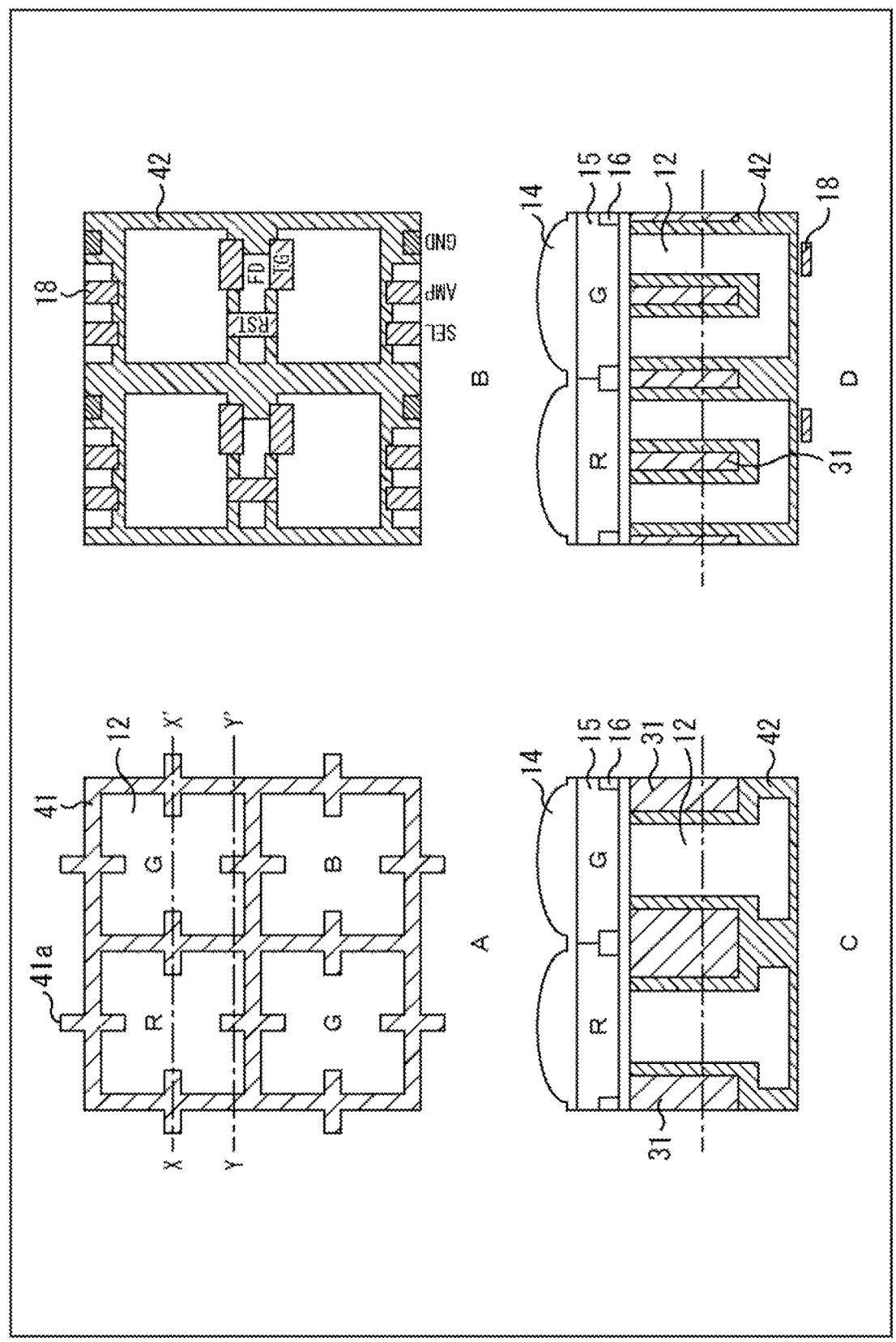
FIG. 5 is a cross-sectional diagram depicting a third configuration example of the solid-state imaging element to which the present technology is applied.

Next, a configuration example (a third configuration example) of the solid-state imaging element according to the third embodiment of the present technology will be described with reference to FIG. 5. The third configuration example is an example in which the DTI in the second configuration example is limited to a Reverse-DTI (hereinafter referred to as an R-DTI).

A of the figure is a cross-sectional diagram in the horizontal direction, depicting a diffusion-layer separation structure in the vicinity of the center of the Si substrate in the third configuration example. B of the figure depicts a cross-sectional diagram in the horizontal direction on the Tr surface of the Si substrate in the third configuration example. C of the figure depicts a cross-sectional diagram in the vertical direction, taken along line X-X' of A of the figure. D of the figure depicts a cross-sectional diagram in the vertical direction, taken along line Y-Y' of A of the figure. It is noted that components common to those in the first and second configuration examples are denoted with the same signs and a description thereof will be omitted as appropriate.

In the third configuration example, an inter-pixel separation section 41 having a similar shape to the inter-pixel separation section 11 in the first configuration example is formed as the Reverse-DTI in which an insulating material is filled from the incident surface side opposite to the Tr surface.

For example, the inter-pixel separation section 41 as the R-DTI includes a single film layer or a laminated film such as AlO, HfO, $SiO_2$, W, and/or poly-Si. Protruding sections 41a protruding toward the PDs 12 from the center of respective sides of each rectangle are formed in the grid-patterned inter-pixel separation section 41 and include the same material as the inter-pixel separation section 41.

Further, each PD 12 is formed in a corresponding one of the regions surrounded by the inter-pixel separation section 41. Each P-type well region 42 is formed between the inter-pixel separation section 41 and the corresponding PD 12.

In the case of the third configuration example, each P-type well region 42 is formed between the inter-pixel separation section 41 including the protruding sections 41a and the corresponding PD 12. This configuration, therefore, increases the surface area of the PN joint portions. As a result, the third configuration example can also increase the signal charge amount Qs of each pixel.

Further, in the case of the third configuration example, as in the second configuration example, since the area of the side wall in each pixel that the incident light strikes can be increased and, moreover, the incident light can also be reflected in the horizontal direction, the optical path length in each PD 12 can be increased. This configuration can, therefore, increase the light receiving sensitivity of each PD 12.

In the third configuration example, moreover, white spots and dark current can be suppressed by forming the inter-pixel separation section 41 as the R-DTI in combination with a film such as $AlO_3$ or $HfO_2$ that causes polarization and making the interface between the R-DTI and each PD 12 a hole accumulation state.

Fourth Embodiment

Figure 6:
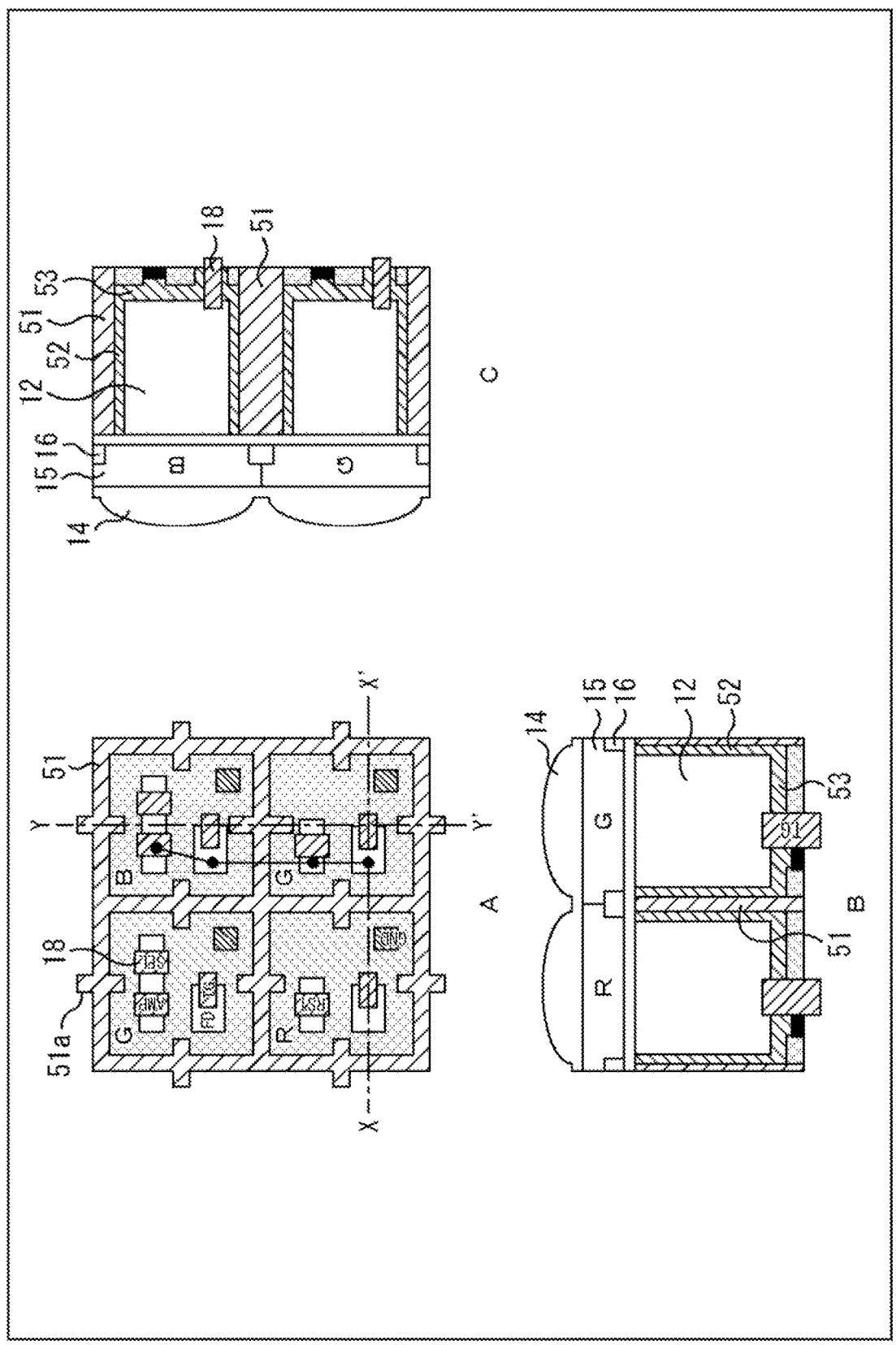
FIG. 6 is a cross-sectional diagram depicting a fourth configuration example of the solid-state imaging element to which the present technology is applied.

Next, a configuration example (a fourth configuration example) of the solid-state imaging element according to the fourth embodiment of the present technology will be described with reference to FIG. 6.

A of the figure depicts a cross-sectional diagram in the horizontal direction on the Tr surface of the Si substrate in the fourth configuration example. B of the figure depicts a cross-sectional diagram in the vertical direction, taken along line X-X' of A of the figure. C of the figure depicts a cross-sectional diagram in the vertical direction, taken along line Y-Y' of A of the figure. It is noted that components common to those in the first to third configuration examples are denoted with the same signs and a description thereof will be omitted as appropriate.

In the fourth configuration example, an inter-pixel separation section 51 having a similar shape to the inter-pixel separation section 11 in the first configuration example is formed as a Front-DTI (hereinafter referred to as an F-DTI) in which an insulating material is filled from the Tr surface side by the FEOL process.

Figure 7:
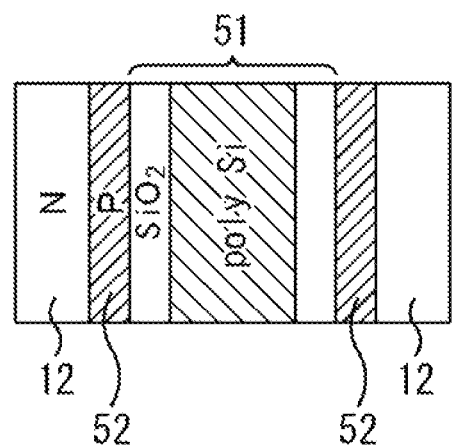
FIG. 7 is a cross-sectional diagram depicting a configuration example of an F-DTI in FIG. 6.

FIG. 7 depicts a cross section of a side wall of the inter-pixel separation section 51 as the F-DTI. Each P-type region 52 is formed on the side wall of the inter-pixel separation section 51 as the F-DTI by isotropically diffusing P-type impurities using plasma doping, solid phase diffusion, vapor-phase diffusion, or the like. With this configuration, it is possible to effectively increase the signal charge amount Qs without reducing the N-type regions of the PDs 12.

For example, the inter-pixel separation section 51 as the F-DTI includes a single film layer or a laminated film such as AlO, HfO, $SiO_2$, W, and/or poly-Si. Protruding sections 51a protruding toward the PDs 12 from the center of respective sides of each rectangle are formed in the grid-patterned inter-pixel separation section 51 and include the same material as the inter-pixel separation section 51.

Further, formation of the PDs 12 even extends to deep portions of respective regions surrounded by the inter-pixel separation section 51. Each PD 12 and the corresponding pixel Tr 18 are structured so as to be vertically stacked. A P-type region 53 is formed in each region separating the pixel Tr gate from the corresponding PD 12.

In the case of the fourth configuration example, each P-type region 52 is formed between the inter-pixel separation section 51 including the protruding sections 51a and the corresponding PD 12. This configuration, therefore, increases the surface area of the PN joint portions. As a result, the fourth configuration example can also increase the signal charge amount Qs of each pixel.

Further, in the case of the fourth configuration example, as in the second configuration example, since the area of the side wall in each pixel that the incident light strikes can be increased and, moreover, the incident light can also be reflected in the horizontal direction, the optical path length in each PD 12 can be increased. This configuration can, therefore, increase the light receiving sensitivity of each PD 12.

In the case of the fourth configuration example, however, since each pixel is completely separated by the F-DTI (inter-pixel separation section 51), each pixel needs a contact for the corresponding P-type well region.

Fifth Embodiment

Figure 8:
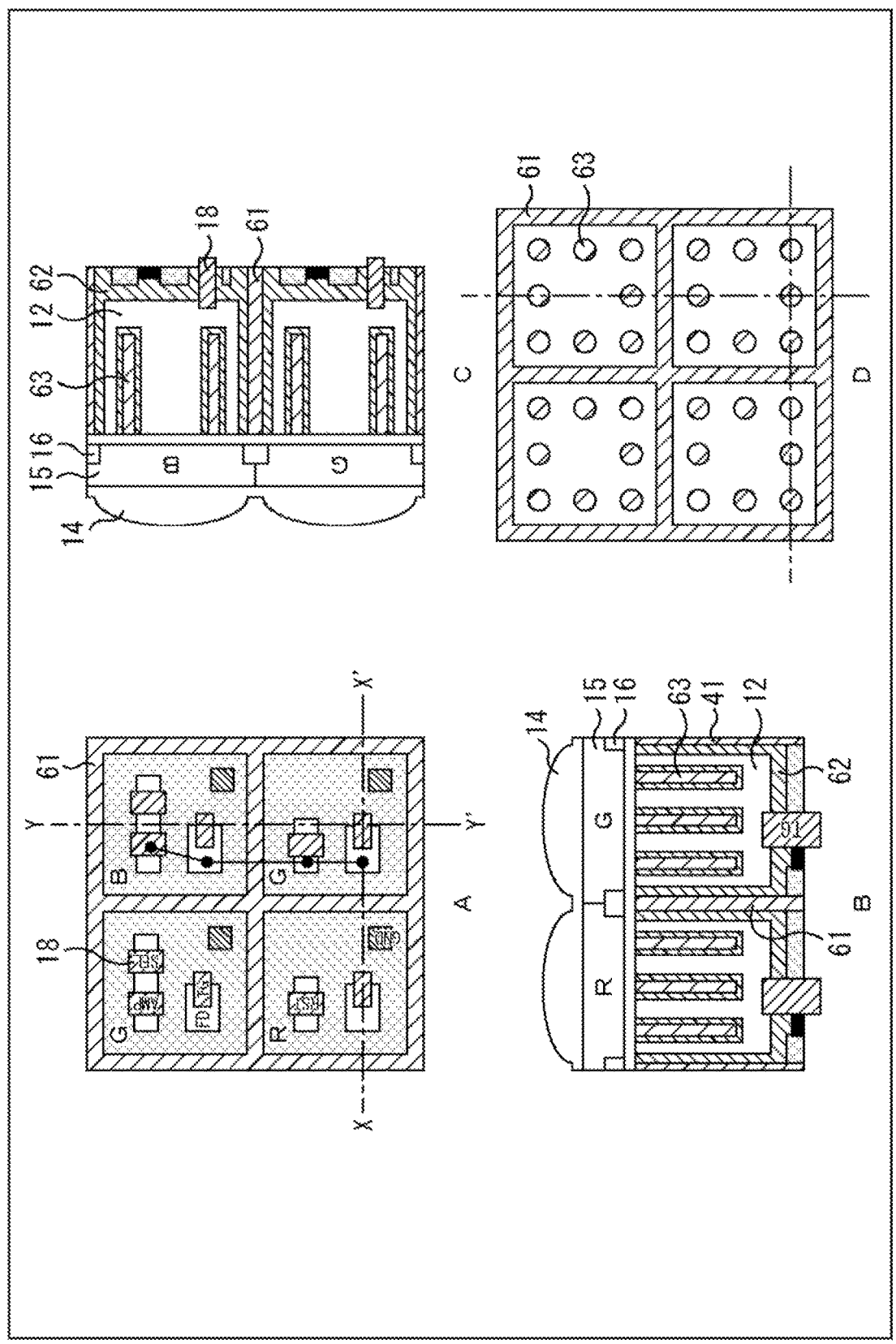
FIG. 8 is a cross-sectional diagram depicting a fifth configuration example of the solid-state imaging element to which the present technology is applied.

Next, a configuration example (a fifth configuration example) of the solid-state imaging element according to the fifth embodiment of the present technology will be described with reference to FIG. 8.

A of the figure depicts a cross-sectional diagram in the horizontal direction on the Tr surface of the Si substrate in the fifth configuration example. B of the figure depicts a cross-sectional diagram in the vertical direction, taken along line X-X' of A of the figure. C of the figure depicts a cross-sectional diagram in the vertical direction, taken along line Y-Y' of A of the figure. D of the figure depicts a cross-sectional diagram in the horizontal direction on the incident surface side. It is noted that components common to those in the first to fourth configuration examples are denoted with the same signs and a description thereof will be omitted as appropriate.

In the fifth configuration example, as depicted in A of the figure, an inter-pixel separation section 61 is formed as the F-DTI filled with an insulating material by the FEOL process from the Tr surface side. The inter-pixel separation section 61 is formed in a grid pattern so as to rectangularly surround each pixel. The PDs 12 of the N-type regions are each formed in a corresponding one of the regions surrounded by the grid-patterned inter-pixel separation section 61. Each P-type well region 62 is formed between the inter-pixel separation section 61 and the corresponding PD 12.

In each region where the PD 12 is formed, a columnar protruding section 63 is provided as an R-DTI formed from the incident surface side.

Figure 9:
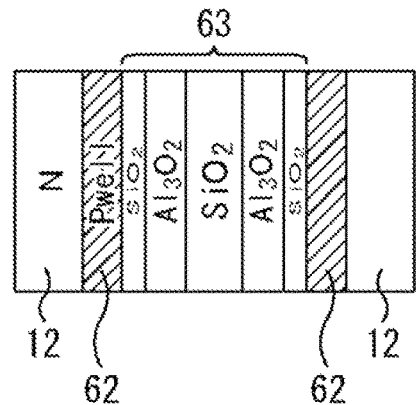
FIG. 9 is a cross-sectional diagram depicting a configuration example of an R-DTI in FIG. 8.

FIG. 9 depicts a cross-sectional diagram of the columnar protruding section 63 as the R-DTI. Each columnar protruding section 63 is formed by laminating films of $SiO_2$ and $Al_3O_2$ having a refractive index lower than the N-type regions forming the PDs 12.

Each P-type well region 62 is formed between the corresponding columnar protruding section 63 and PD 12.

Forming the columnar protruding sections 63 as the R-DTI allows each columnar protruding section 63 and the corresponding pixel Tr 18 to be arranged in a stack in the longitudinal direction.

In the case of D of the figure, the columnar protruding sections 63 have a circular shape in cross section. However, the columnar protruding sections 63 may have an elliptical shape in cross section or a polygonal shape with three or more sides in cross section. Further, in the case of D of the figure, the number of columnar protruding sections 63 formed in each pixel is eight. However, the number of columnar protruding sections 63 in each pixel may be one or two or greater.

It is noted that in a case where the plurality of columnar protruding sections 63 is formed in one pixel, the plurality of columnar protruding sections 63 is formed so as to sandwich the corresponding PD 12 without any contact between the columnar protruding sections 63. This configuration can increase the light receiving sensitivity of each PD 12 since incident light is reflected between the columnar protruding sections 63.

Further, in a case where the plurality of columnar protruding sections 63 is formed in one pixel, the plurality of columnar protruding sections 63 is formed so as to sandwich the corresponding PD 12 without any contact between the P-type well regions 62 provided between the columnar protruding sections 63 and the PD 12. This configuration can increase the surface area of the PN joint portions, thereby increasing the signal charge amount Qs of each pixel.

In the case of the fifth configuration example, the grid-patterned inter-pixel separation section 61 is provided. This configuration can, therefore, suppress leakage of the incident light into adjacent pixels, allowing suppression of color mixture.

Further, in the case of the fifth configuration example, the columnar protruding sections 63 are provided. This configuration can increase the incident light in each pixel and increase the optical path length in each PD 12. This configuration can, therefore, increase the light receiving sensitivity of each PD 12. Moreover, providing the columnar protruding sections 63 can increase the surface area of the PN joint portions, thereby increasing the signal charge amount Qs of each pixel.

<Modifications>

Next, modifications of the pixel separation section will be described.

Figure 10:
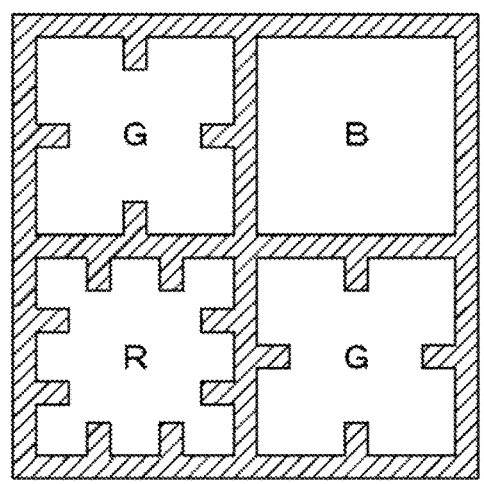
FIG. 10 is a diagram depicting a first modification of a pixel separation section.

FIG. 10 depicts a first modification of the pixel separation section including the protruding sections. In the first modification, the number of protruding sections varies according to the color of (the color filter of) the pixel.

In the case of the figure, no protruding section is formed in a B pixel, while four protruding sections are formed in each G pixel and eight protruding sections are formed in an R pixel. Generally, the absorption coefficient for R is the lowest while the absorption coefficient for B is the highest among absorption coefficients for respective wavelengths of R, G, and B in Si. Therefore, increasing the number of protruding sections in each R pixel can increase the light receiving sensitivity of R in the corresponding PD 12.

It is noted that in addition to the number of protruding sections, the length, thickness, position, and/or the like may also vary according to the pixel color.

Figure 11:
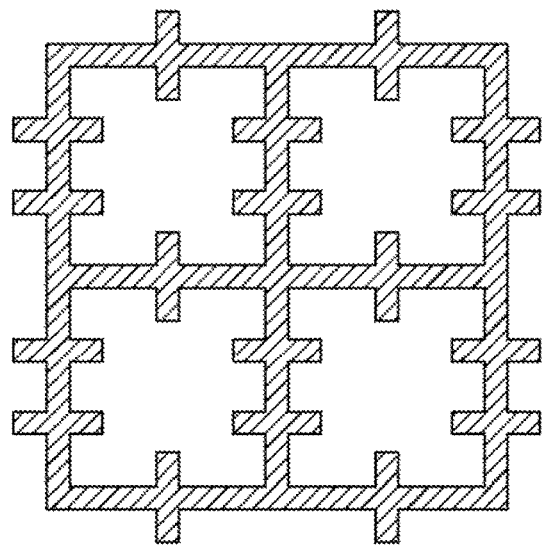
FIG. 11 is a diagram depicting a second modification of the pixel separation section.

FIG. 11 depicts a second modification of the pixel separation section including the protruding sections. In the second modification, the number of protruding sections varies depending on the longitudinal side or the lateral side of the grid-patterned inter-pixel separation section. In the case of the figure, two protruding sections are formed on each longitudinal side of each pixel, while one protruding section is formed on each lateral side of each pixel. It is noted that the combination of the numbers of protruding sections on the longitudinal sides and the lateral sides of each pixel is not limited to the example depicted in the figure.

Figure 12:
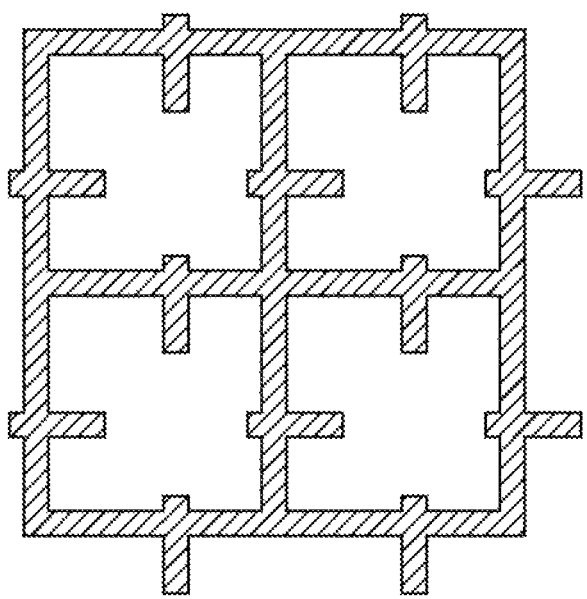
FIG. 12 is a diagram depicting a third modification of the pixel separation section.

FIG. 12 depicts a third modification of the pixel separation section including the protruding sections. In the third modification, for example, the projecting sections on the side opposite to the optical center are elongated or the center positions of the protruding sections are shifted according to the distance of each pixel from the optical center. This configuration can, therefore, increase the reflection efficiency of light incident from an oblique direction, allowing pupil correction that reduces peripheral darkening.

Figure 13:
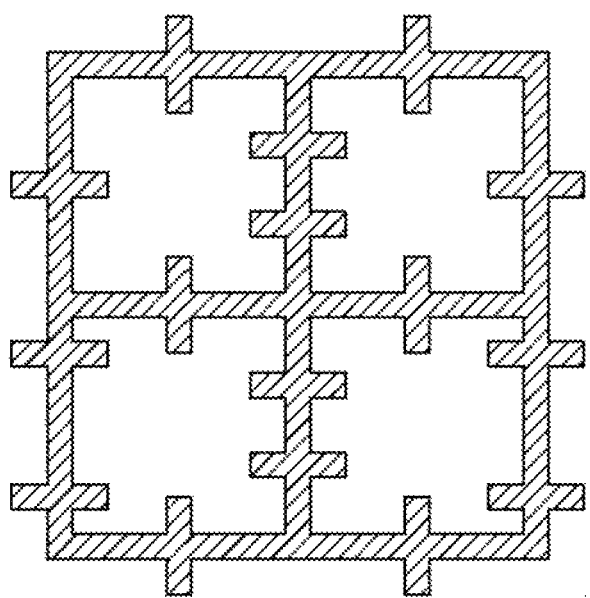
FIG. 13 is a diagram depicting a fourth modification of the pixel separation section.

FIG. 13 depicts a fourth modification of the pixel separation section including the protruding sections. In the fourth modification, the number of protruding sections varies according to the side of the grid-patterned inter-pixel separation section.

This configuration allows adjustment of the sensitivity difference among the pixels in which the layout of the Tr and wiring is necessary for each pixel. The sensitivity difference may possibly occur in a case where an FD (floating diffusion) is shared among the plurality of pixels, for example. It is noted that in addition to the number of protruding sections, the length, thickness, position, and/or the like may also vary according to the side.

Figure 14:
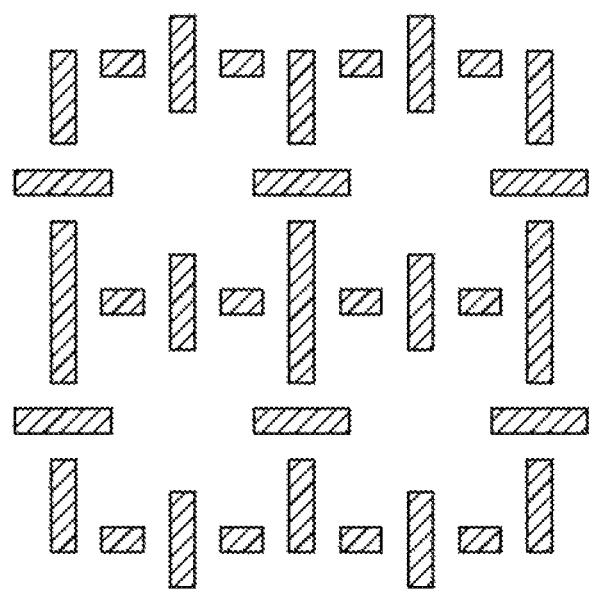
FIG. 14 is a diagram depicting a fifth modification of the pixel separation section.

FIG. 14 depicts a fifth modification of the pixel separation section including the protruding sections. The fifth modification is formed such that portions in the lateral direction and portions in the longitudinal direction of the inter-pixel separation section and the protruding sections are not perpendicular to each other.

Usually, the presence of an intersecting portion in a DIT increases the line width of the intersecting portion, resulting in an increase in the etching rate. The absence of such an intersecting portion can, therefore, suppress these problems.

Figure 15:
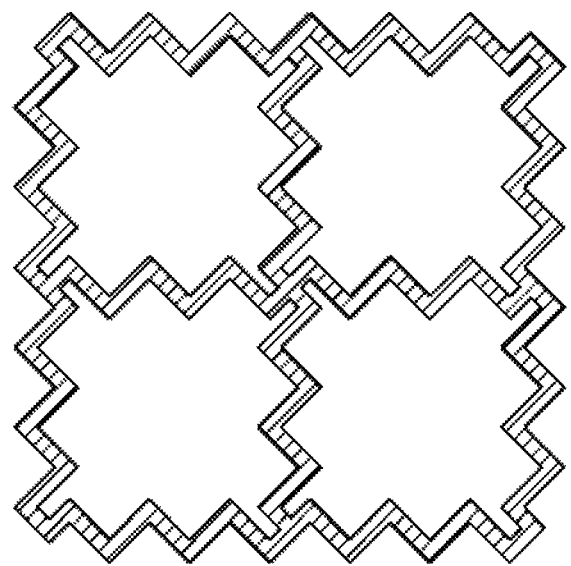
FIG. 15 is a diagram depicting a sixth modification of the pixel separation section.

FIG. 15 depicts a sixth modification of the pixel separation section. In the sixth modification, the sides of the inter-pixel separation section are not straight lines but are formed in a zigzag in a triangular wave shape.

In the case of the figure, the sides of the inter-pixel separation section are formed in a wave shape. It is noted that in addition to the triangular wave shape, the sides of the inter-pixel separation section may be formed in a shape of continuous semicircles or semi-rectangles.

Figure 16:
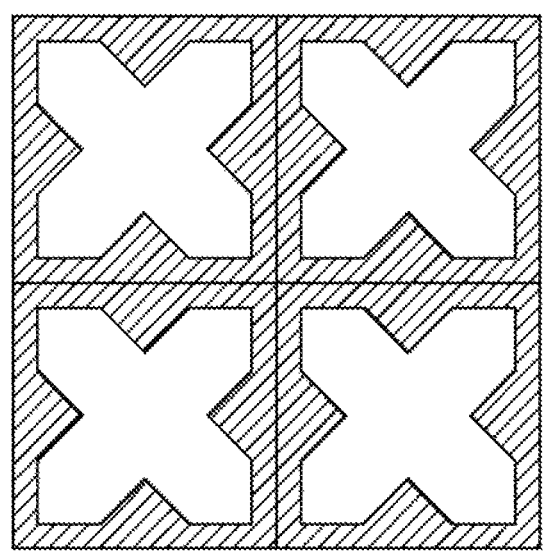
FIG. 16 is a diagram depicting a seventh modification of the pixel separation section.

FIG. 16 depicts a seventh modification of the pixel separation section including the protruding sections. In the seventh modification, the protruding sections have a triangular shape. It is noted that in addition to the triangular shape, the protruding sections may have a semicircular shape or a polygonal shape.

<Example of Application to In-Vivo Information Acquisition System>

The technology according to the present disclosure (the present technology) can be applied to various products. For example, the technology according to the present disclosure may be applied to an endoscopic surgery system.

Figure 17:
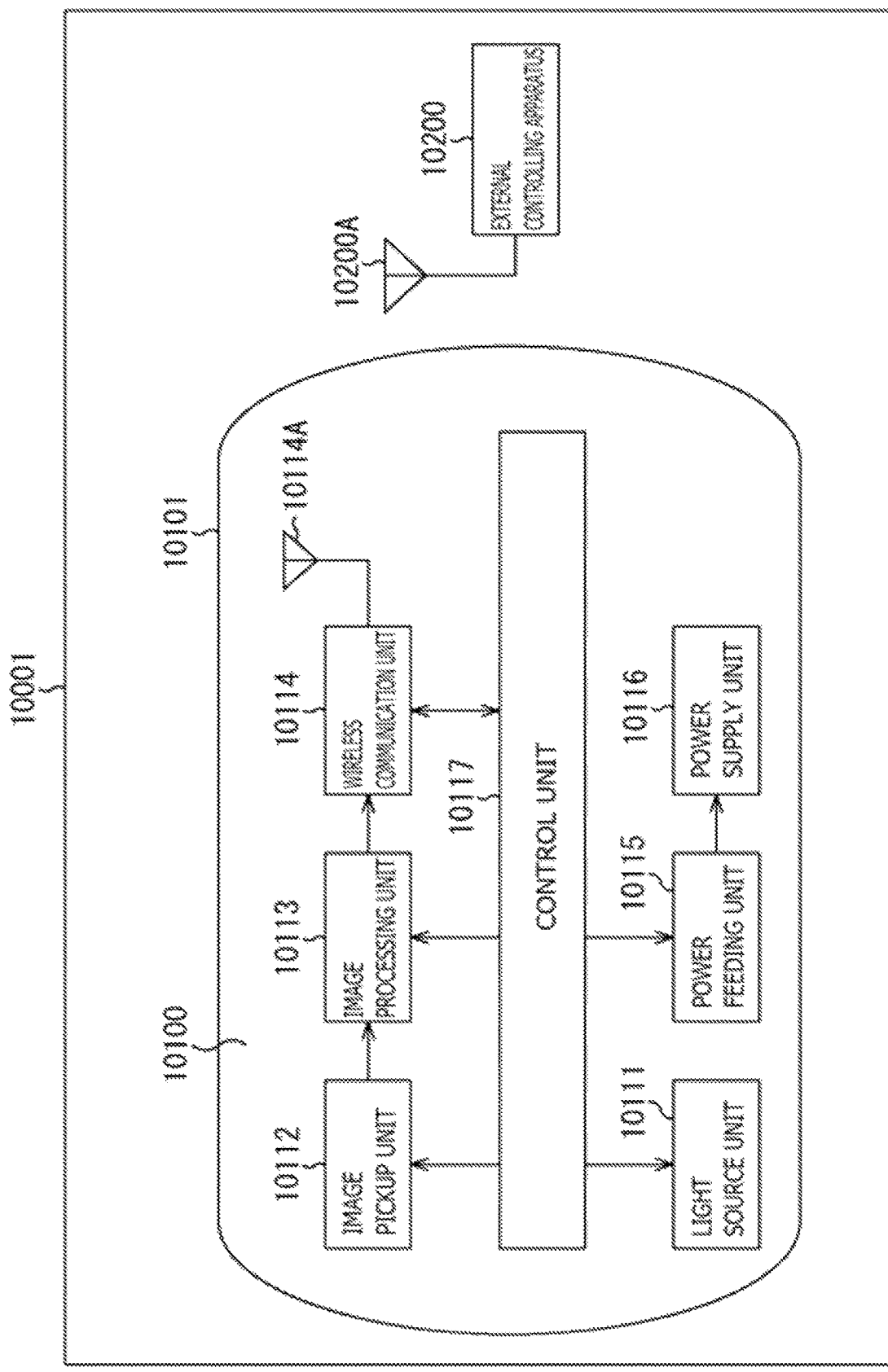
FIG. 17 is a block diagram depicting an example of a schematic configuration of an in-vivo information acquisition system.

FIG. 17 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 17, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure can be applied has been described above. The technology according to the present disclosure can be applied to the image pickup unit 10112 among the configurations described above.

<Example of Application to Mobile Body>

The technology according to the present disclosure (the present technology) can be applied to various products. For example, the technology according to the present disclosure may be implemented as a device to be mounted on any type of a mobile body such as an automobile, an electric vehicle, a hybrid electric vehicle, a motorcycle, a bicycle, a personal mobility, an airplane, a drone, a ship, or a robot.

Figure 18:
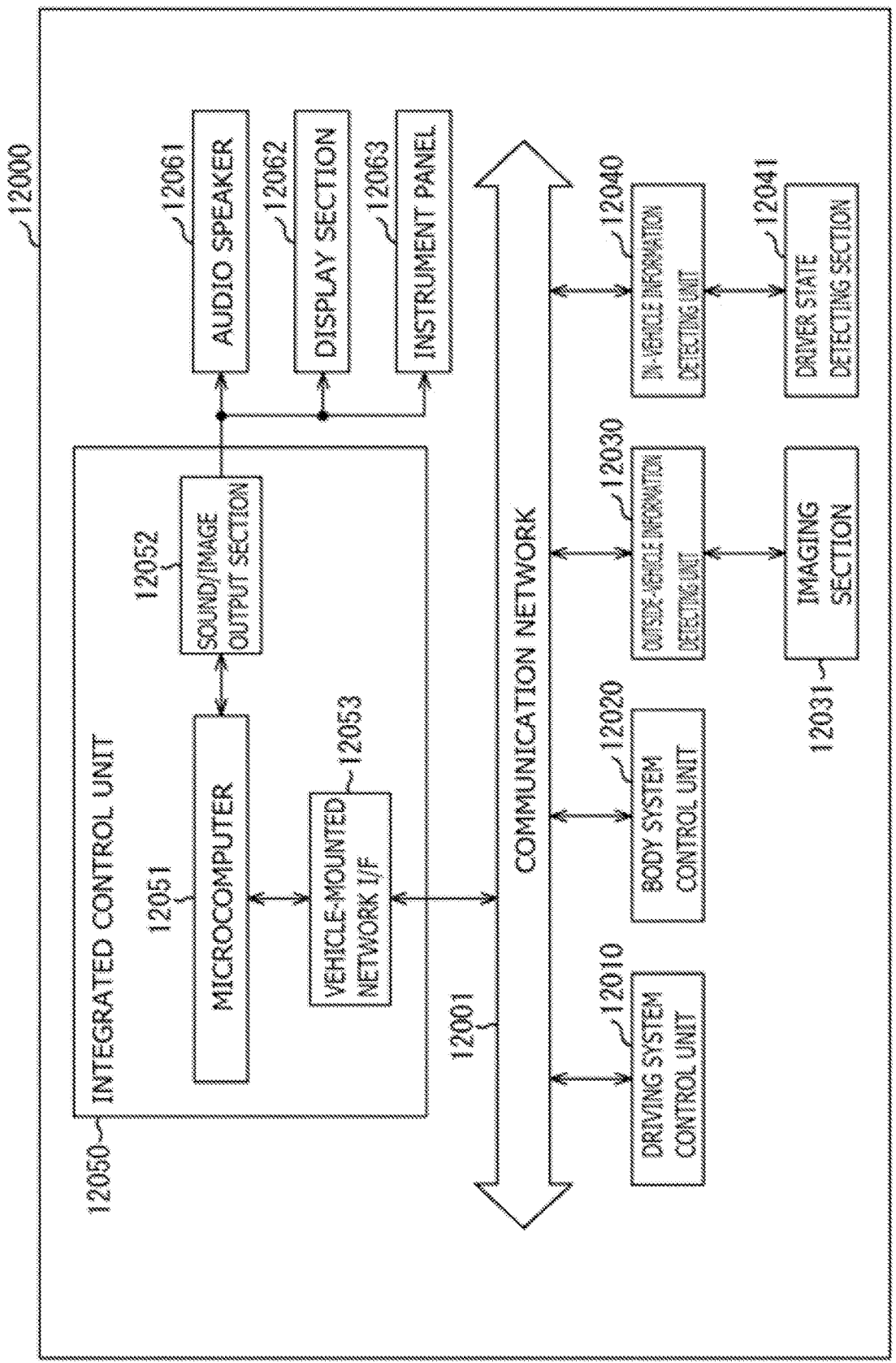
FIG. 18 is a block diagram depicting an example of schematic configuration of a vehicle control system.

FIG. 18 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 18, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 18, an audio speaker 12061, a display section 12062, and an instrument panel 12063 are illustrated as the output device. The display section 12062 may, for example, include at least one of an on-board display and a head-up display.

Figure 19:
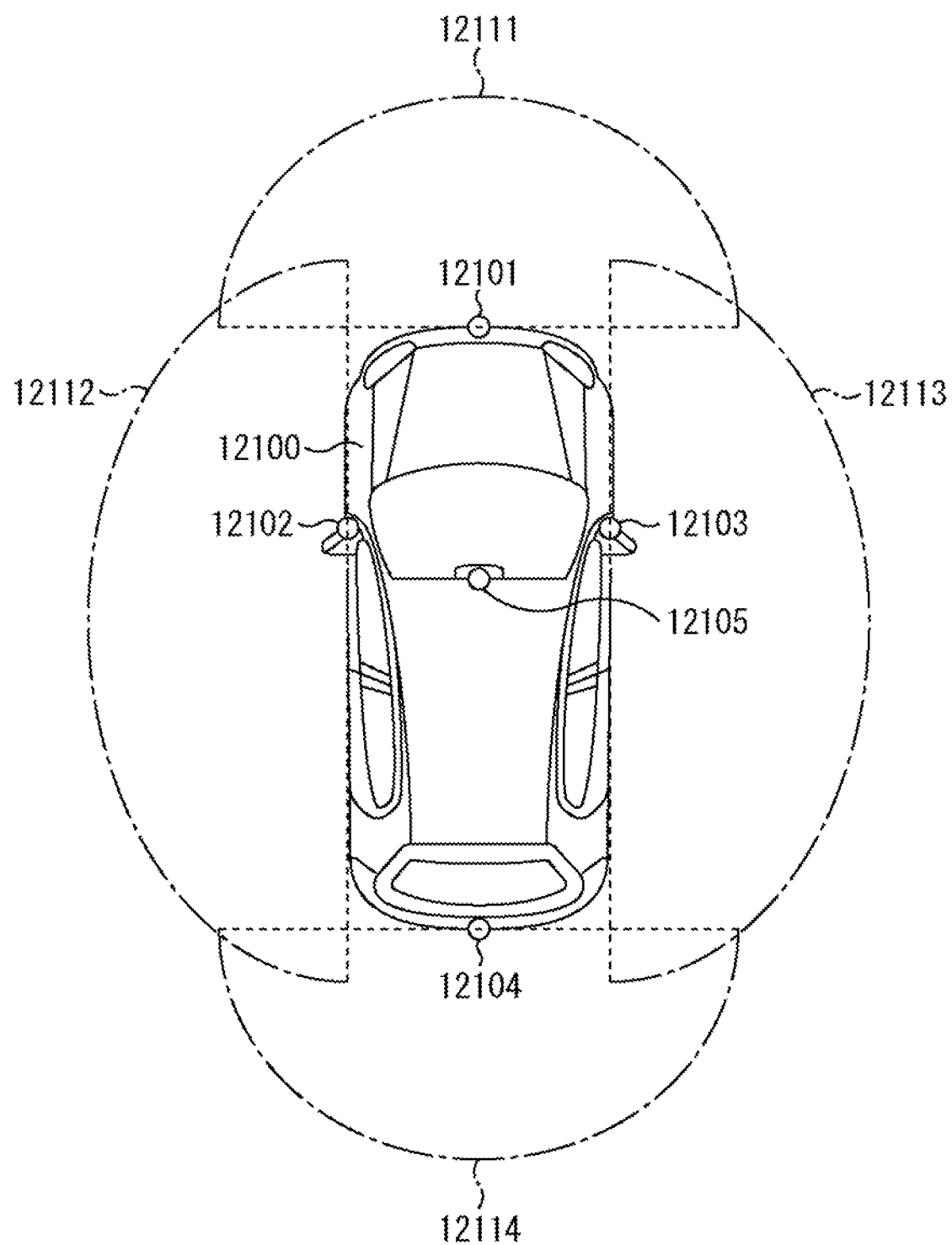
FIG. 19 is a diagram of assistance in explaining an example of installation positions of an outside-vehicle information detecting section and an imaging section.

FIG. 19 is a diagram depicting an example of the installation position of the imaging section 12031.

In FIG. 19, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 19 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to the imaging section 12031 among the configurations described above.

It is noted that the embodiments of the present technology are not limited to the above-described embodiments, and various modifications can be made without departing from the scope of the present technology.

The present technology can also be configured as follows.

(1)

A solid-state imaging element including:

a photoelectric conversion section formed in each pixel; and an inter-pixel separation section separating the photoelectric conversion section of each pixel, in which the inter-pixel separation section includes a protruding section having a shape protruding toward the photoelectric conversion section.

(2)
  The solid-state imaging element according to (1), further including:
    a region between the inter-pixel separation section and the photoelectric conversion section, the region being different in conductivity type from the photoelectric conversion section.
(3)
  The solid-state imaging element according to (1) or (2), in which
    the inter-pixel separation section includes at least one of a material having a refractive index lower than the photoelectric conversion section or a light reflection material.
(4)
  The solid-state imaging element according to any one of (1) to (3), in which
    the inter-pixel separation section includes a DTI formed on a substrate from a light incident surface side.
(5)
  The solid-state imaging element according to any one of (1) to (3), in which
    the inter-pixel separation section includes a DTI formed on the substrate from a surface side opposite to a light incident surface.
(6)
  The solid-state imaging element according to any one of (1) to (5), in which
    the inter-pixel separation section is formed in a grid pattern such that the photoelectric conversion section is separated for each pixel.
(7)
  The solid-state imaging element according to (6), in which
    a length of the inter-pixel separation section in a depth direction is different between the protruding section and a side of the grid pattern.
(8)
  The solid-state imaging element according to any one of (1) to (7), in which
    the protruding section included in the inter-pixel separation section varies according to each pixel color.
(9)
  The solid-state imaging element according to any one of (1) to (7), in which
    the protruding section included in the inter-pixel separation section varies in length according to each pixel color.
(10)
  The solid-state imaging element according to any one of (1) to (7), in which
    the protruding section included in the inter-pixel separation section varies in width according to each pixel color.
(11)
  The solid-state imaging element according to any one of (1) to (7), in which
    the protruding section included in the inter-pixel separation section varies in number according to each pixel color.
(12)
  The solid-state imaging element according to any one of (1) to (7), in which
    the protruding section included in the inter-pixel separation section varies according to a pattern of a shared pixel.
(13)
  The solid-state imaging element according to any one of (1) to (7), in which
    the protruding section included in the inter-pixel separation section varies in length according to the pattern of the shared pixel.
(14)
  The solid-state imaging element according to any one of (1) to (7), in which
    the protruding section included in the inter-pixel separation section varies in width according to the pattern of the shared pixel.
(15)
  The solid-state imaging element according to any one of (1) to (7), in which
    the protruding section included in the inter-pixel separation section varies in number according to the pattern of the shared pixel.
(16)
  The solid-state imaging element according to any one of (1) to (7), in which
    the protruding section included in the inter-pixel separation section varies according to a distance from an optical center to a corresponding pixel.
(17)
  The solid-state imaging element according to (6), in which
    the inter-pixel separation section including the protruding section does not include a part in which a portion in a lateral direction and a portion in a longitudinal direction are perpendicular to each other.
(18)
  The solid-state imaging element according to (6) or (7), in which
    a side of the grid pattern of the inter-pixel separation section has a linear shape.
(19)
  The solid-state imaging element according to (6) or (7), in which
    a side of the grid pattern of the inter-pixel separation section has a zigzag shape.
(20)
  The solid-state imaging element according to (6) or (7), in which
    a side of the grid pattern of the inter-pixel separation section has a triangular wave shape.
(21)
  The solid-state imaging element according to (6) or (7), in which
    a side of the grid pattern of the inter-pixel separation section has a shape of continuous semicircles.
(22)
  The solid-state imaging element according to (6) or (7), in which
    a side of the grid pattern of the inter-pixel separation section has a shape of continuous semi-rectangles.
(23)
  The solid-state imaging element according to (1), in which
    the inter-pixel separation section includes a well region different in conductivity type from the photoelectric conversion section.
(24)
  A solid-state imaging element including:
    a photoelectric conversion section formed in each pixel;
    a grid-patterned inter-pixel separation section separating the photoelectric conversion section of each pixel; and a columnar protruding section formed inside the photoelectric conversion section.

(25)
The solid-state imaging element according to (24), further including:
a well region between the inter-pixel separation section and the protruding section; and the photoelectric conversion section, the well region being different in conductivity type from the photoelectric conversion section.

(26)
The solid-state imaging element according to (24) or (25), in which
the protruding section includes at least one of a material having a refractive index lower than the photoelectric conversion section or a light reflection material.

(27)
The solid-state imaging element according to any one of (24) to (26), in which
the protruding section includes a DTI formed on a substrate from a light incident surface side, and
the inter-pixel separation section includes a DTI formed on the substrate from a surface side opposite to a light incident surface.

(28)
The solid-state imaging element according to any one of (24) to (27), in which
the protruding section has a cylindrical shape.

(29)
The solid-state imaging element according to any one of (24) to (27), in which
the protruding section has a polygonal column shape.

(30)
The solid-state imaging element according to any one of (1) to (29), in which
the solid-state imaging element includes a back-illuminated type.

(31)
Electronic equipment including:
a solid-state imaging element, in which
the solid-state imaging element includes
a photoelectric conversion section formed in each pixel, and
an inter-pixel separation section separating the photoelectric conversion section of each pixel, and
the inter-pixel separation section includes a protruding section having a shape protruding toward the photoelectric conversion section.

(32)
Electronic equipment including:
a solid-state imaging element, in which
the solid-state imaging element includes
a photoelectric conversion section formed in each pixel,
a grid-patterned inter-pixel separation section separating the photoelectric conversion section of each pixel, and
a columnar protruding section formed inside the photoelectric conversion section.

REFERENCE SIGNS LIST

10 Si substrate, 11 Inter-pixel separation section, 11*a* Protruding section, 12 PD, 13 PN joint portion, 14 OCL, 15 CF, 16 Inter-CF light blocking section, 17 STI, 18 Tr gate, 19 Wiring layer, 21 Inter-pixel separation section, 21*a* Protruding section, 41 Inter-pixel separation section, 41*a* Protruding section, 42 P-type well region, 51 Inter-pixel separation section, 51*a* Protruding section, 52 P-type region, 61 Inter-pixel separation section, 61*a* Protruding section, 62 P-type well region, 63 Columnar protruding section

What is claimed is:

1. A light detecting device, comprising:
a plurality of pixels;
a photoelectric conversion section included in each of the pixels; and
a grid-patterned inter-pixel separation section separating the photoelectric conversion sections of each of the pixels from one another, wherein, for each of at least a first pixel and a second pixel included in the plurality of pixels, the grid-patterned inter-pixel separation section includes a protruding section in a plan view;
wherein the first pixel includes a first floating diffusion that is configured to accumulate a charge in response to receiving light within a first wavelength range,
wherein the second pixel includes a second floating diffusion that is configured to accumulate a charge in response to receiving light within a second wavelength range,
wherein the first pixel is adjacent to the second pixel in the plan view, and
wherein a position of the protruding section in the first pixel is different from a position of the protruding section in the second pixel in the plan view.

2. The light detecting device according to claim 1, wherein the protruding section of at least the first pixel includes a first part and a second part at least in the plan view.

3. The light detecting device according to claim 2, wherein the first part faces the second part in the plan view.

4. The light detecting device according to claim 1, wherein the grid-patterned inter-pixel separation section includes a deep trench isolation (DTI).

5. The light detecting device according to claim 4, wherein the grid-patterned inter-pixel separation section is formed in a substrate from a surface side opposite to a light incident surface.

6. The light detecting device according to claim 1, further comprising:
a region between the grid-patterned inter-pixel separation section and the photoelectric conversion section, the region being different in conductivity type from the photoelectric conversion section.

7. The light detecting device according to claim 6, wherein the region is disposed along a shape of the protruding section in the plan view.

8. The light detecting device according to claim 1, wherein the grid-patterned inter-pixel separation section includes a material having a refractive index lower than a refractive index of a material of the photoelectric conversion section.

9. An electronic device, comprising:
a light detecting device, including:
a plurality of pixels;
a photoelectric conversion section included in each of the pixels; and
a grid-patterned inter-pixel separation section separating the photoelectric conversion sections of each of the pixels from one another, wherein, for each of at least a first pixel and a second pixel included in the plurality of pixels, the grid-patterned inter-pixel separation section includes a protruding section in a plan view;

wherein the first pixel includes a first floating diffusion that is configured to accumulate a charge in response to receiving light within a first wavelength range, wherein the second pixel includes a second floating diffusion that is configured to accumulate a charge in response to receiving light within a second wavelength range, wherein the first pixel is adjacent to the second pixel in the plan view, and wherein a position of the protruding section in the first pixel is different from a position of the protruding section in the second pixel in the plan view.

10. The electronic device according to claim 9, wherein the protruding section of at least the first pixel includes a first part and a second part at least in the plan view.

11. The electronic device according to claim 10, wherein the first part faces the second part in the plan view.

12. The electronic device according to claim 9, wherein the grid-patterned inter-pixel separation section includes a deep trench isolation (DTI).

13. The electronic device according to claim 12, wherein the grid-patterned inter-pixel separation section is formed in a substrate from a surface side opposite to a light incident surface.

14. The electronic device according to claim 9, further comprising:

a region between the grid-patterned inter-pixel separation section and the photoelectric conversion section, the region being different in conductivity type from the photoelectric conversion section.

15. The electronic device according to claim 14, wherein the region is disposed along a shape of the protruding section in the plan view.

16. The electronic device according to claim 9, wherein the grid-patterned inter-pixel separation section includes a material having a refractive index lower than a refractive index of a material of the photoelectric conversion section.

\* \* \* \* \*